US009466530B2

(12) United States Patent
Zhang et al.

(10) Patent No.: US 9,466,530 B2
(45) Date of Patent: Oct. 11, 2016

(54) METHODS OF FORMING AN IMPROVED VIA TO CONTACT INTERFACE BY SELECTIVE FORMATION OF A METAL SILICIDE CAPPING LAYER

(71) Applicant: GLOBALFOUNDRIES Inc., Grand Cayman (KY)

(72) Inventors: Xunyuan Zhang, Albany, NY (US); Tibor Bolom, Litomerice (CZ); Errol Todd Ryan, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/526,729

(22) Filed: Oct. 29, 2014

(65) Prior Publication Data

US 2016/0126135 A1  May 5, 2016

(51) Int. Cl.
*H01L 21/768* (2006.01)
*H01L 23/522* (2006.01)
*H01L 23/532* (2006.01)

(52) U.S. Cl.
CPC ... *H01L 21/76883* (2013.01); *H01L 21/76802* (2013.01); *H01L 21/76843* (2013.01); *H01L 23/5226* (2013.01); *H01L 23/53233* (2013.01); *H01L 23/53266* (2013.01); *H01L 2924/0002* (2013.01)

(58) Field of Classification Search
CPC .......... H01L 21/76883; H01L 23/53266; H01L 23/53233; H01L 23/5226; H01L 21/76843; H01L 21/76802
See application file for complete search history.

(56) References Cited

U.S. PATENT DOCUMENTS

| | | | |
|---|---|---|---|
| 4,822,642 A | 4/1989 | Cabrera et al. | |
| 6,245,674 B1* | 6/2001 | Sandhu | H01L 21/28518 257/E21.584 |
| 2003/0058678 A1* | 3/2003 | Kim | H01L 27/11502 365/100 |
| 2004/0110379 A1 | 6/2004 | Yoshioka et al. | |
| 2005/0051854 A1 | 3/2005 | Cabral, Jr. et al. | |
| 2007/0080461 A1* | 4/2007 | Lu | H01L 21/76807 257/758 |
| 2007/0090325 A1* | 4/2007 | Hwang | H01L 21/31111 252/79.1 |
| 2008/0093741 A1* | 4/2008 | Lee | H01L 27/10888 257/755 |
| 2008/0099921 A1 | 5/2008 | Katata | |
| 2009/0139568 A1 | 6/2009 | Weidman et al. | |
| 2011/0215390 A1* | 9/2011 | Kim | H01L 29/861 257/306 |
| 2013/0334693 A1 | 12/2013 | Alptekin et al. | |

OTHER PUBLICATIONS

Yang et al., "Characterization of Selectively Deposited Cobalt Capping Layers: Selectivity and Electromigration Resistance," IEEE Electron Device Letters, 31:728-730, Jul. 2010.
Office Action from related U.S. Appl. No. 14/526,678 dated Mar. 9, 2016.
Final Office Action from related U.S. Appl. No. 14/526,678 dated Jul. 22, 2016.

* cited by examiner

*Primary Examiner* — Bilkis Jahan
(74) *Attorney, Agent, or Firm* — Amerson Law Firm, PLLC

(57) ABSTRACT

One illustrative method disclosed herein includes, among other things, forming an opening in at least one layer of insulating material so as to thereby expose at least a portion of a conductive contact, performing a selective metal silicide formation process to selectively form a metal silicide layer in the opening and on the conductive contact, depositing at least one conductive material above the selectively formed metal silicide layer so as to over-fill the opening, and performing at least one planarization process so as to remove excess materials and thereby define a conductive via that is positioned in the opening and conductively coupled to the selectively formed metal silicide layer and to the conductive contact.

14 Claims, 16 Drawing Sheets

METHODS OF FORMING AN IMPROVED VIA TO CONTACT INTERFACE BY SELECTIVE FORMATION OF A METAL SILICIDE CAPPING LAYER

BACKGROUND OF THE INVENTION

1. Field of the Invention

Generally, the present disclosure relates to the manufacture of semiconductor devices, and, more specifically, to various methods of forming an improved interface between a conductive via and a conductive contact structure by selective formation of a metal silicide capping layer.

2. Description of the Related Art

In modern integrated circuits, such as microprocessors, storage devices and the like, a very large number of circuit elements, especially transistors, are provided and operated on a restricted chip area Immense progress has been made over recent decades with respect to increased performance and reducing the physical size (feature sizes) of circuit elements, such as transistors. Field effect transistors (FETs) come in a variety of configurations, e.g., planar transistor devices, FinFET devices, nanowire devices, etc. Irrespective of the form of the FET, they have a gate electrode, a source region, a drain region and a channel region positioned between the source and drain regions. The state of the field effect transistor ("ON" or "OFF") is controlled by the gate electrode. Upon the application of an appropriate control voltage to the gate electrode, the channel region becomes conductive, thereby allowing current to flow between the source and drain regions.

Typically, due to the large number of circuit elements and the required complex layout of modern integrated circuits, the electrical connections of the individual circuit elements cannot be established within the same device level on which the circuit elements are manufactured. Rather, integrated circuit products typically have one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first lower end of which is connected to a respective contact region of a circuit element, such as a gate electrode and/or the drain and source regions of transistors, and a second end is connected to a respective metal line in the metallization layer by a conductive via. Such vertical contact structures are considered to be "device-level" contacts or simply "contacts" within the industry, as they contact the "device" that is formed in the silicon substrate. The contact structures may comprise contact elements or contact plugs having a generally square-like or round shape that are formed in an interlayer dielectric material, which in turn encloses and passivates the circuit elements. In other applications, the contact structures may be line-type features, e.g., source/drain contact structures.

FIGS. 1A-1H depict one illustrative prior art technique for forming contact structures for semiconductor devices. FIG. 1A is a simplified view of an illustrative prior art transistor device 10 at an early stage of manufacturing. The device 10 is formed in an active region of a semiconductor substrate 12 that is defined by a simplistically depicted trench isolation region 14. The device 10 also includes a schematically depicted gate structure 16, a gate cap layer 18 (e.g., silicon nitride), sidewall spacers 20, source/drain regions 22, a thin native oxide layer 13 (that is formed when the source/drain regions are exposed to air, and it may or may not be present in all situations) and an illustrative layer of insulating material 24. Although the layer of insulating material 24 is simplistically depicted as being a single layer of material, in practice, the layer of insulating material 24 may be comprised of a plurality of layers of insulating material, perhaps with an intervening etch stop layer formed between such layers of material.

FIG. 1B depicts the device 10 after one or more etching processes were performed through a patterned etch mask (not shown), such as a patterned layer of photoresist or a patterned hard mask layer, to define illustrative contact openings or trenches 26 in the layer of insulating material 24. The formation of the contact openings 26 normally exposes a portion of the source/drain regions 22. However, as depicted in FIG. 1C, as part of the contact formation process, a pre-clean process will normally be performed to remove any residual insulating materials, including the exposed portions of the native oxide layer 13 (when present) to insure that the upper surface of the source/drain regions 22 are exposed.

FIG. 1D depicts the device 10 after a schematically depicted barrier layer/adhesion layer 28 was formed on the device 10. In one embodiment, the barrier layer/adhesion layer 28 may be comprised of a first barrier layer of titanium nitride and a second adhesion layer made of diborane ($B_2H_6$), both of which may be formed by performing sequential conformal deposition processes, e.g., atomic layer deposition (ALD), etc. After the barrier layer/adhesion layer 28 is formed, a conductive material layer 30, such as tungsten, is formed in the contact openings 26. As depicted, in many situations, a schematically depicted seam 31, or vertically oriented void, will form in the contact openings 26. The seam 31 is believed to form because the openings 26 tend to "pinch-off" when it is filled. The layer of insulating material 24 may be comprised of a variety of different materials, e.g., silicon dioxide, etc., and it may be formed to any desired thickness. The conductive material layer 30 may be comprised of a variety of different metals or metal compounds, e.g., Ti, W, Mo, Co, TiN, Al, etc.

FIG. 1E depicts the device 10 after one or more chemical mechanical polishing (CMP) operations were performed to remove the excess amounts of the barrier layer/adhesion layer 28 and the conductive material layer 30 positioned outside of the contact openings 26. These operations result in the formation of conductive contacts 32 in the contact openings 26. As depicted, portions of the seam or void 31 remain in the contact 32, and an opening 33 to the interior of the void 31 may be present.

FIG. 1F depicts the device after several process operations were performed. More specifically, an etch stop layer 40, a layer of insulating material 42 and another etch stop layer 44 were deposited above the structure depicted in FIG. 1E. Thereafter, various openings 41 for various metallization structures were defined in the layers 40, 42 and 44 by performing known etching and masking process operations. The openings 41 expose the contacts 32 and the void 31 formed therein.

Next, as shown in FIG. 1G, a schematically depicted barrier layer/adhesion layer 46 was formed across the device and in the openings 41. In the case where copper metallization layers will be formed for the device, the barrier layer/adhesion layer 46 may be comprised of a first barrier layer of tantalum nitride (TaN) and a second adhesion layer made of tantalum, both of which may be formed by performing sequential conformal deposition processes, e.g., ALD, physical vapor deposition (PVD), etc. Other materials, such as cobalt and ruthenium, may be employed as part of the barrier layer/adhesion layer 46. Then, an illustrative layer of conductive material 48, e.g., copper, may be deposited in the openings 41 using traditional techniques.

FIG. 1H depicts the device after one or more CMP process operations were performed to remove the excess materials positioned outside of the openings 41 above the etch stop layer 44. This results in the formation of a conductive via 43 (VO) and a combination conductive via (VO)—metal line (M1) 45. Unfortunately, after the barrier layer/adhesion layer 46 is formed, portions of the void 31 may remain unfilled, as indicated in the dashed-line regions 50. Thus, there is an absence of the barrier layer/adhesion layer 46 under the conductive vias (VO), which can provide a path for undesired copper migration and otherwise undesirably locally increase the resistance of the connection at the interface between the via (VO) and the contact structure 32.

The present disclosure is directed to various methods of forming an improved interface between a conductive via and a conductive contact structure by selective formation of a metal silicide capping layer that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an improved interface between a conductive via and a conductive contact structure by selective formation of a metal silicide capping layer. One illustrative method disclosed herein includes, among other things, forming an opening in at least one layer of insulating material positioned above a conductive contact that is conductively coupled to a transistor device so as to thereby expose at least a portion of the conductive contact, performing a selective metal silicide formation process to selectively form a metal silicide layer in the opening and on the conductive contact, depositing at least one conductive material above the selectively formed metal silicide layer so as to over-fill the opening and performing at least one planarization process so as to remove excess materials positioned outside of the opening and thereby define a conductive via that is positioned in the opening and conductively coupled to the selectively formed metal silicide layer and to the conductive contact.

Another illustrative method disclosed herein includes, among other things, forming at least one layer of insulating material above a conductive contact that is conductively coupled to a transistor device, wherein the conductive contact has a void formed therein, forming an opening in the at least one layer of insulating material so as to expose at least a portion of the conductive contact and the void and performing a selective metal silicide formation process to selectively form a metal silicide layer in the opening and on the conductive contact and above the void in the conductive contact, wherein performing the selective metal silicide formation process comprises generating a plasma environment at a temperature of 400° C. or less and introducing a silicon-containing precursor gas into the plasma environment. In this example, the method further includes depositing at least one conductive material above the selectively formed metal silicide layer so as to over-fill the opening and performing at least one planarization process so as to remove excess materials positioned outside of the opening and thereby define a conductive via that is positioned in the opening and conductively coupled to the metal silicide layer and the conductive contact, wherein the selective metal silicide formation process is performed such that sidewalls of the opening in the at least one layer of insulating material along an entire vertical height of the conductive via are substantially free of the metal silicide layer.

One illustrative device disclosed herein includes, among other things, a conductive contact that is conductively coupled to a transistor device, at least one layer of insulating material having an opening defined therein, the opening being positioned above at least a portion of the conductive contact, a conductive via positioned in the opening, the conductive via comprising at least one conductive barrier layer, at least one conductive adhesion layer, and a bulk conductive material and a metal silicide layer positioned between the conductive via and the conductive contact, wherein sidewalls of the opening in the at least one layer of insulating material along an entire vertical height of the conductive via are substantially free of the metal silicide layer.

BRIEF DESCRIPTION OF THE DRAWINGS

The disclosure may be understood by reference to the following description taken in conjunction with the accompanying drawings, in which like reference numerals identify like elements, and in which.

Figure 1A:
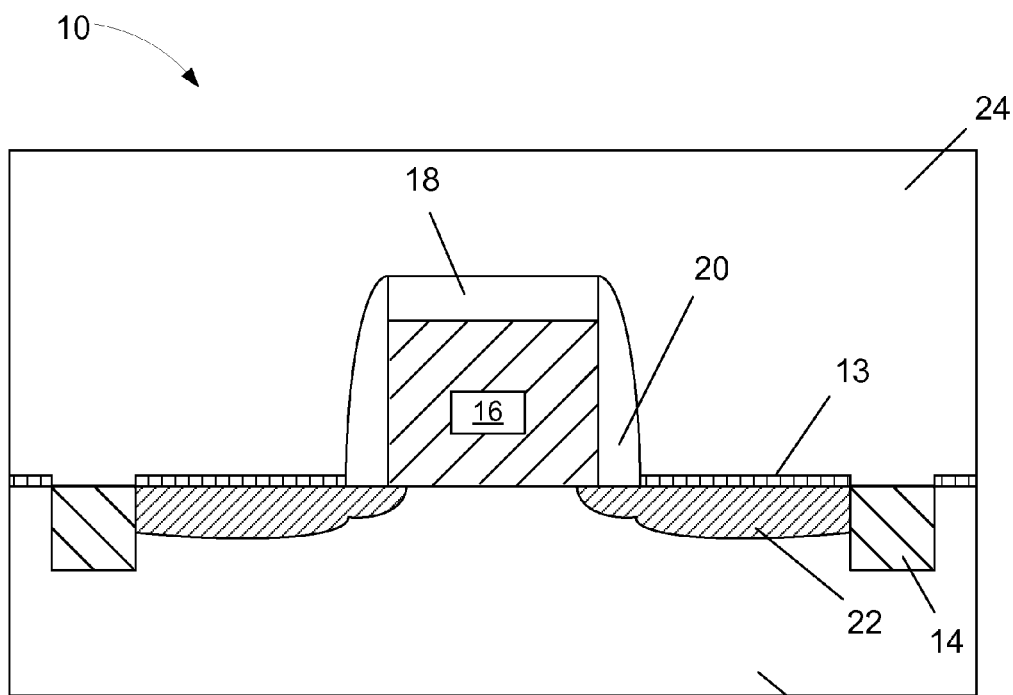
FIGS. 1A-1H depict one illustrative prior art method of forming conductive structures to the contact level of an integrated circuit product and some problems that may be encountered using such prior art processing techniques.
Figure 1B:
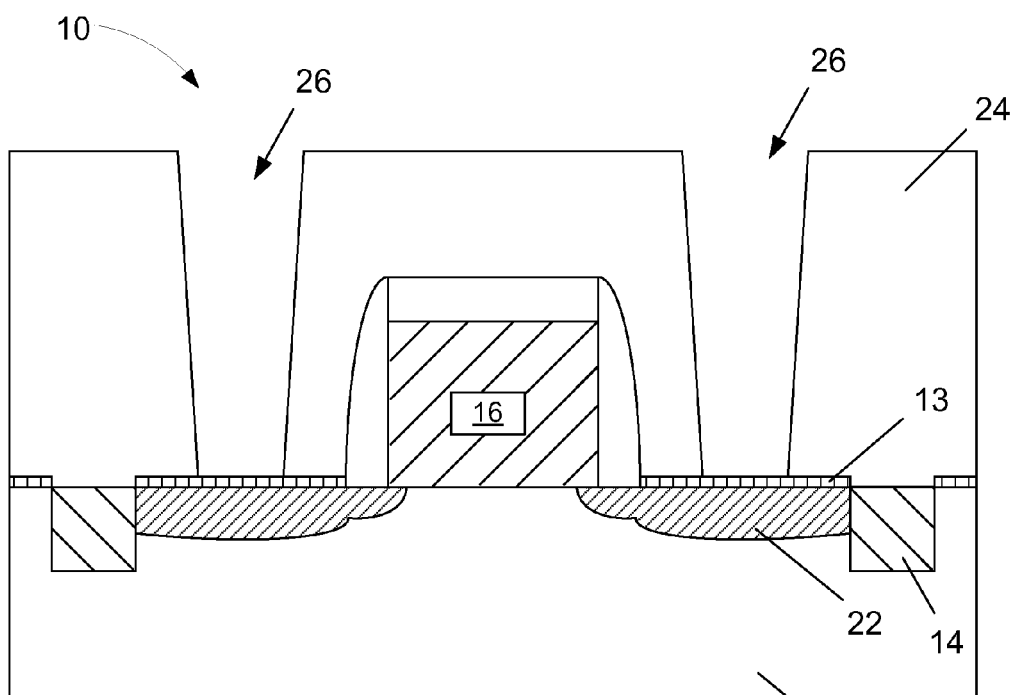
Figure 1C:
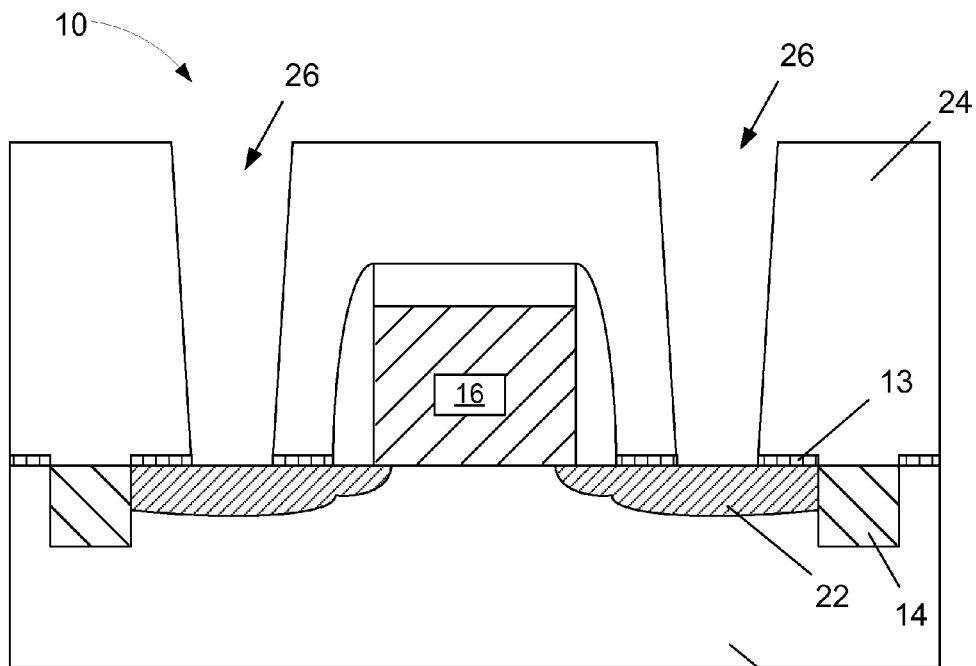
Figure 1D:
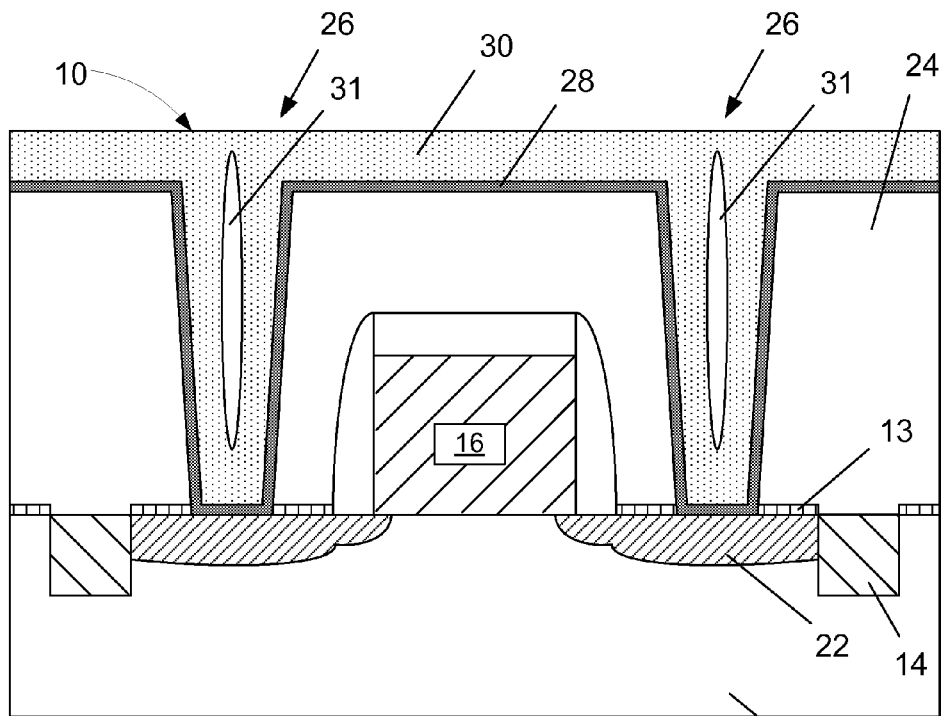
Figure 1E:
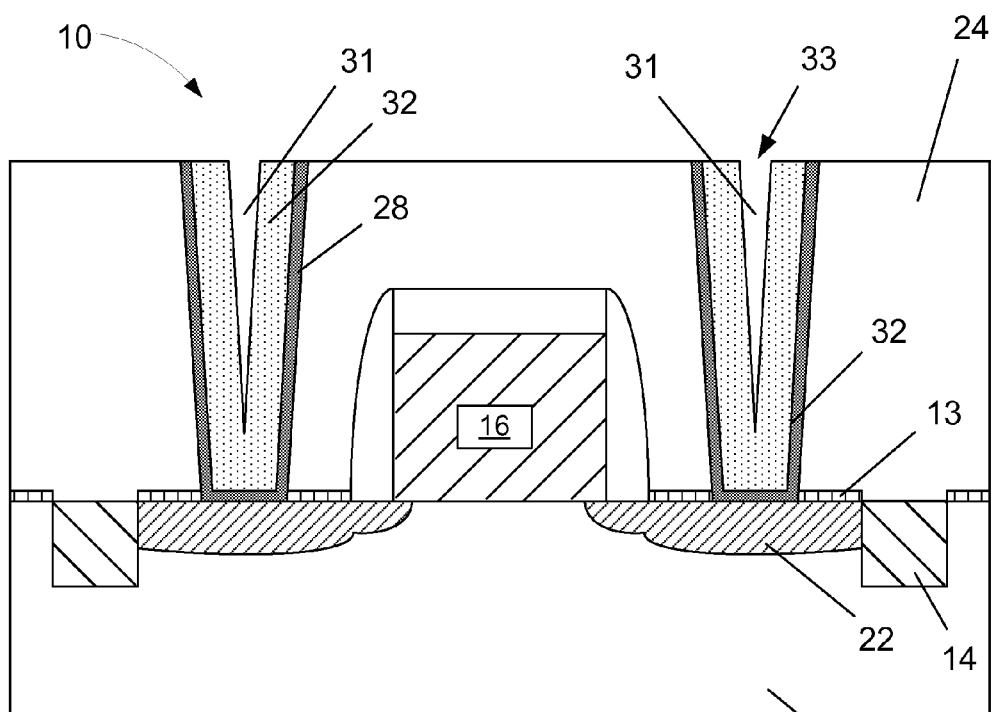

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming an improved interface between a conductive via and a conductive contact structure. As will be readily apparent to those skilled in the art upon a complete reading of the present application, the methods disclosed herein may be employed when forming conductive structures that contact a variety of different semiconductor devices, e.g., transistors, memory cells, resistors, etc., and may be employed when forming conductive structures for a variety of different integrated circuit products, including, but not limited to, ASIC's, logic devices, memory devices, etc. With reference to the attached drawings, various illustrative embodiments of the methods disclosed herein will now be described in more detail.

Figure 1F:
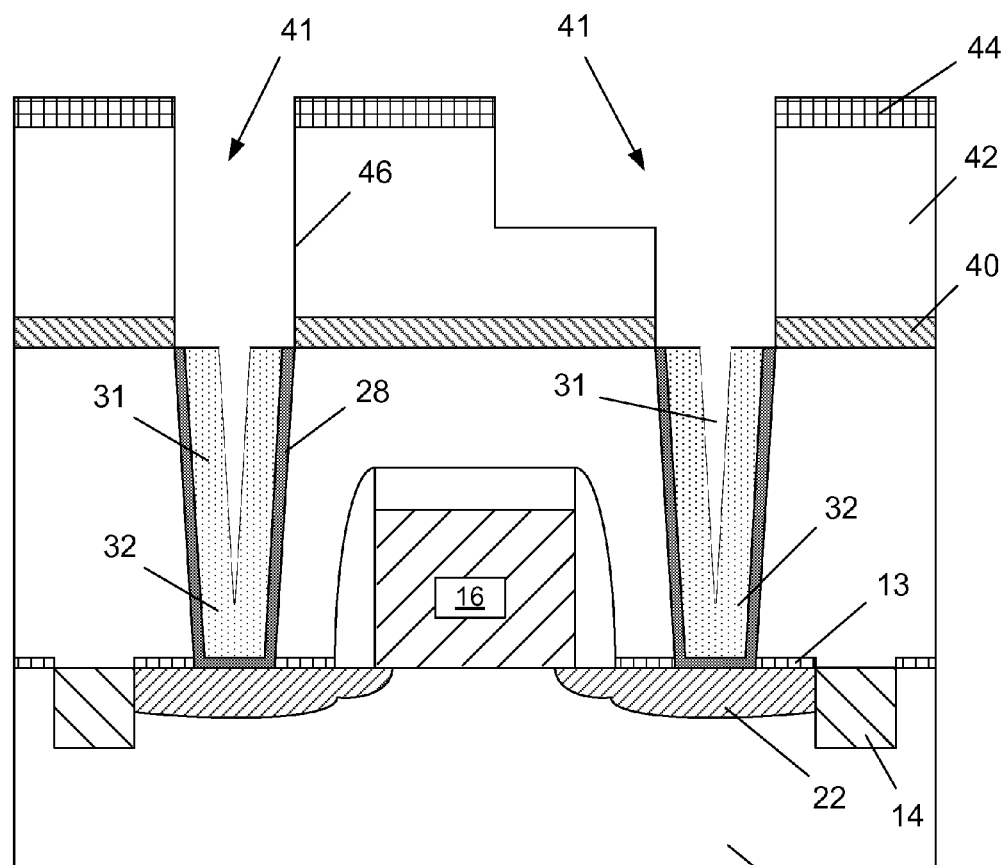
Figure 1G:
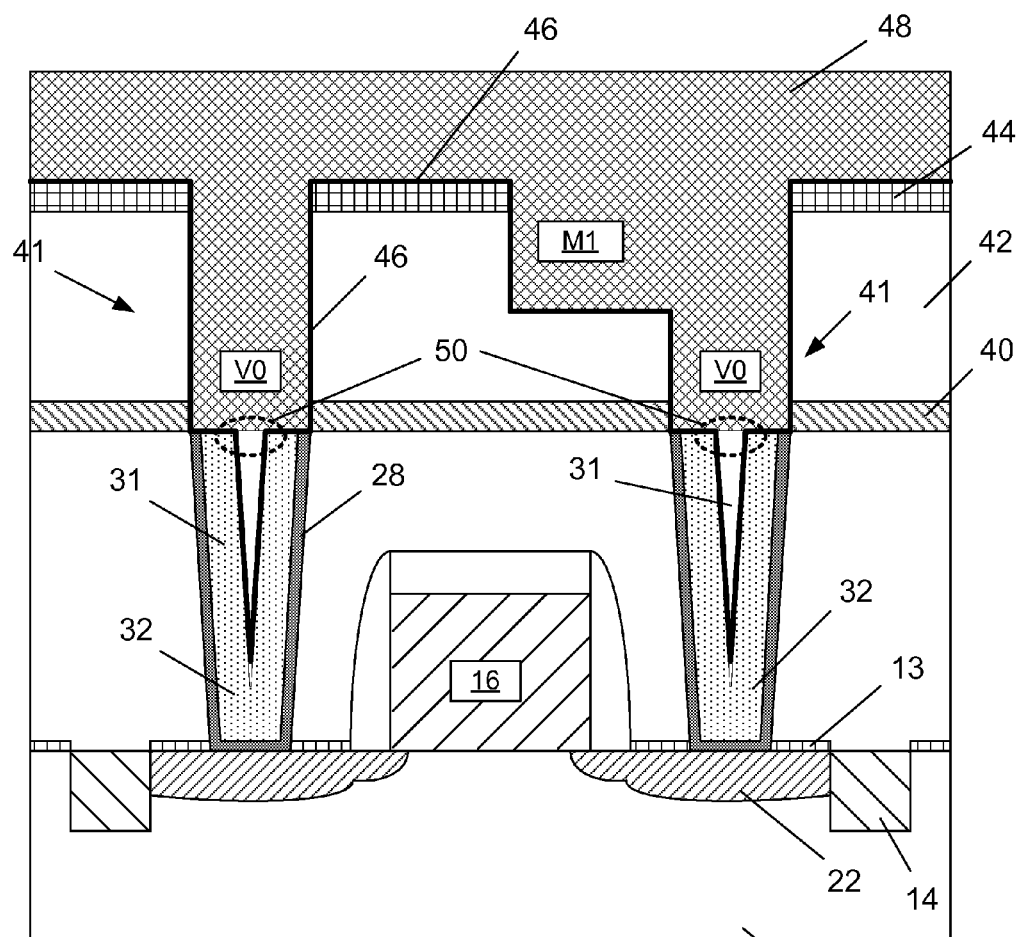
Figure 1H:
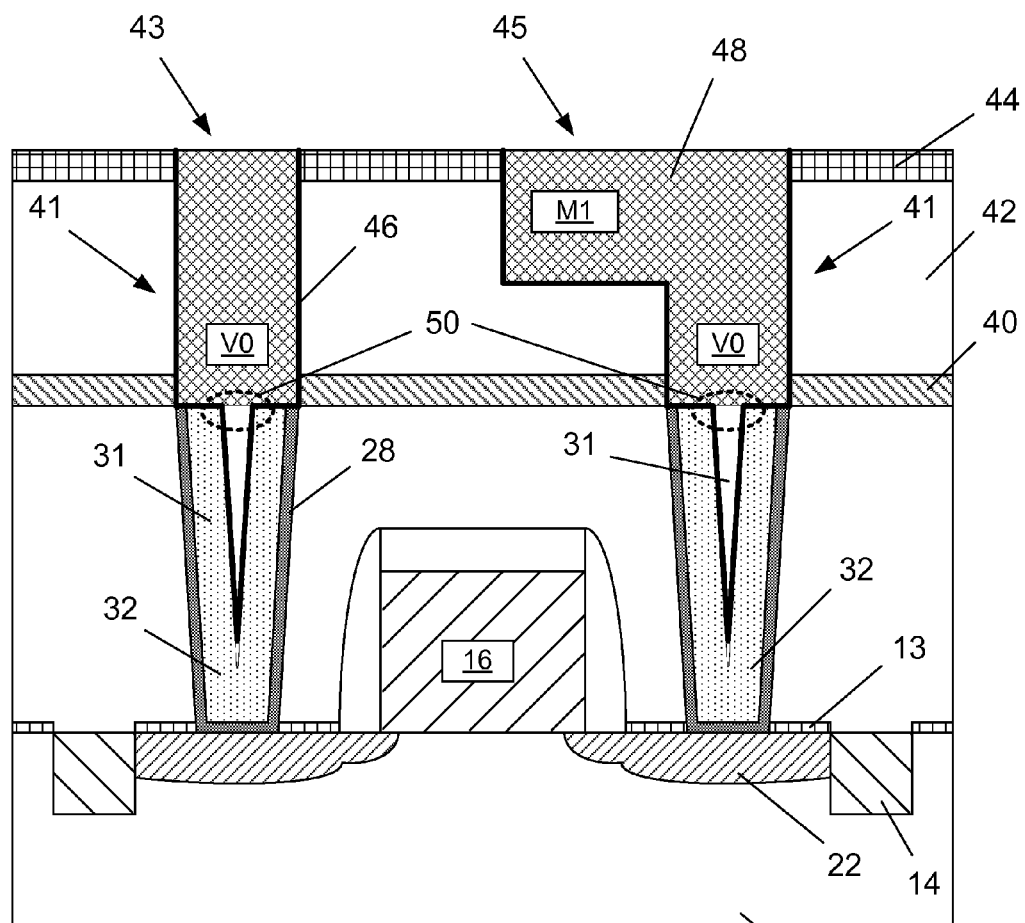
Figure 2A:
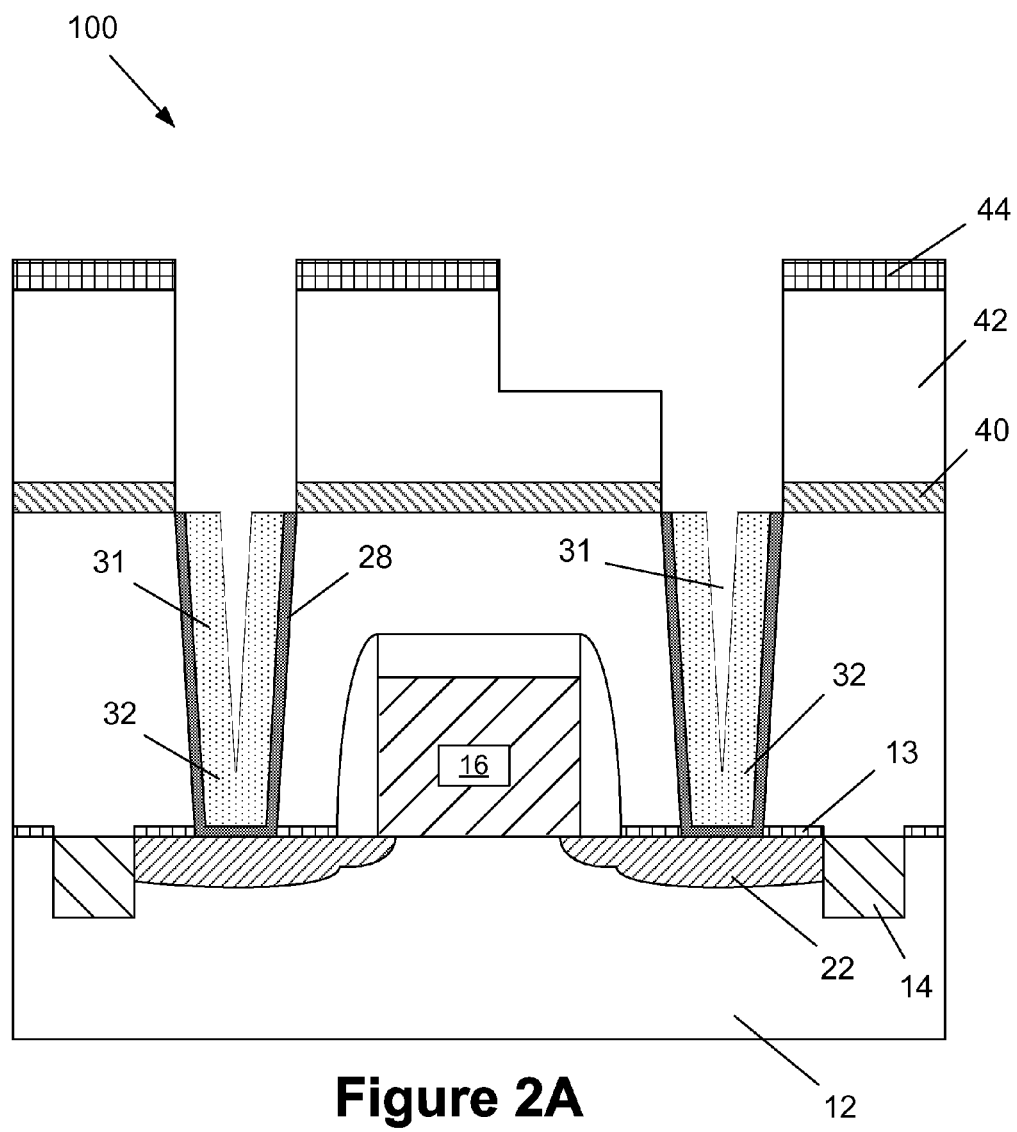
FIGS. 2A-2E depict one illustrative method disclosed herein for forming an improved interface between a conductive via and a conductive contact structure by selective formation of a conductive capping layer.

FIGS. 2A-2E depict one illustrative method disclosed herein for forming an improved interface between a conductive via and a conductive contact structure by selective formation of a conductive capping layer. FIG. 2A depicts the device 100 at a point in processing that corresponds to that depicted in FIG. 1F. The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a contact or a conductive line or via, commonly found on integrated circuit devices. The conductive structures depicted, described and claimed in this application are intended to be representative in nature as they may represent any type of conductive feature or structure on an integrated circuit product. In the examples depicted herein, the conductive structures are depicted as having a representative barrier and/or adhesion layer. In practice, there may be one or more such barrier/adhesion layers used in a real-world device. The conductive structures described and discussed herein may be made of any type of conductive material, e.g., a metal or a metal alloy, such as copper or a copper-based material.

Figure 2B:
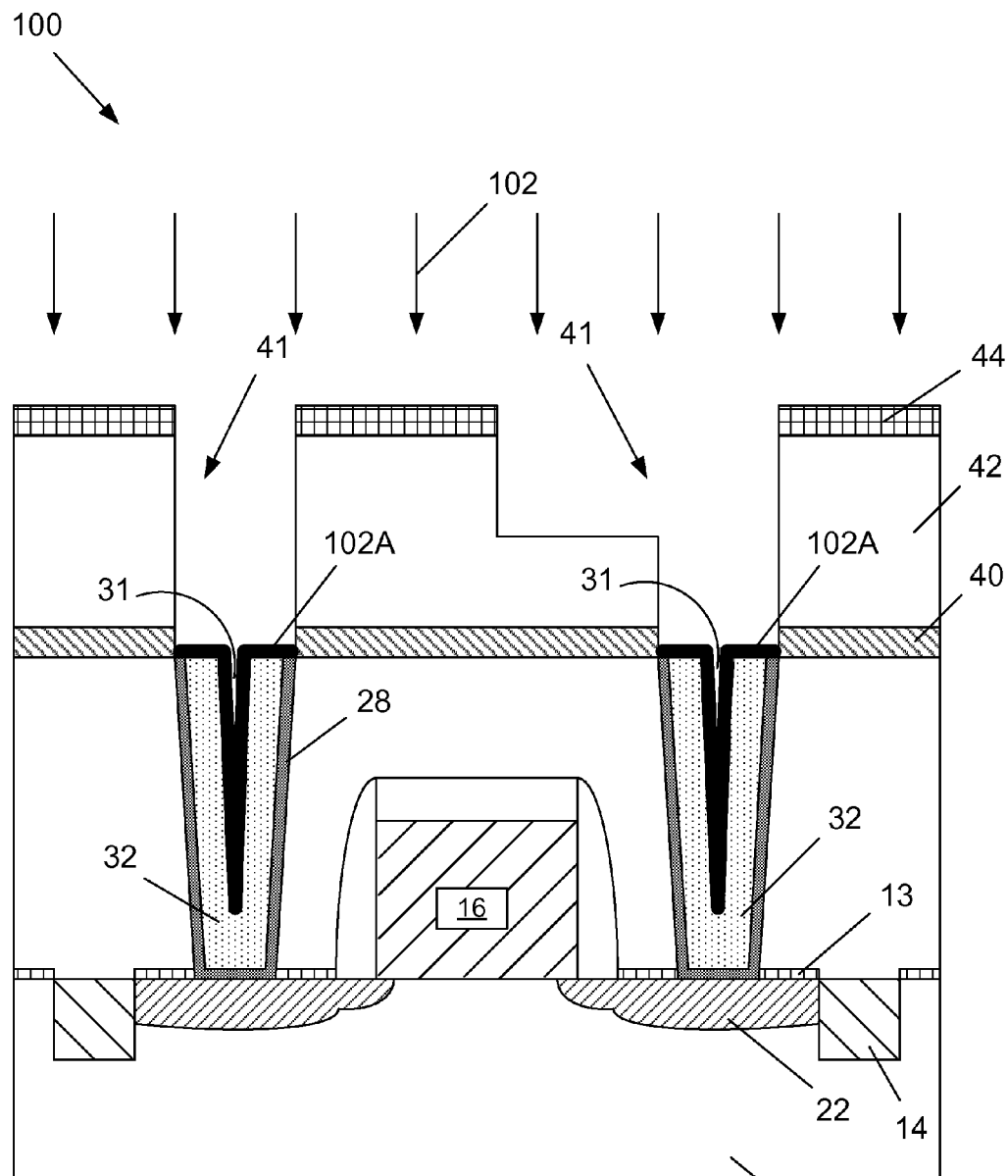

FIG. 2B depicts the device 100 after a selective deposition process was performed to selectively form a layer of conductive material 102A on the contact 32. As depicted, the selectively formed layer of conductive material 102A may only partially fill the seam 31. In one embodiment, the selectively formed layer of conductive material 102A may be comprised of a material such as cobalt, nickel, etc., it may be formed by performing a selective conformal chemical vapor deposition (CVD) process, and it may be formed to any desired thickness, e.g., 0.5-5 nm. During this selective deposition process 102, substantially none of the selectively formed layer of conductive material 102A is formed on the layers of insulating materials openings 41, considering the entire height of the opening 41 as it extends through the multiple layers of insulating material. The manner in which the selective formation of such materials may be accomplished is well known to those skilled in the art. For example, see "Characterization of Selectively Deposited Cobalt Capping Layers: Selectivity and Electromigration Resistance," Yang et al., *IEEE Electron Device Letters*, Vol. 31, No. 7, July 2010, which is hereby incorporated by reference in its entirety.

Figure 2C:
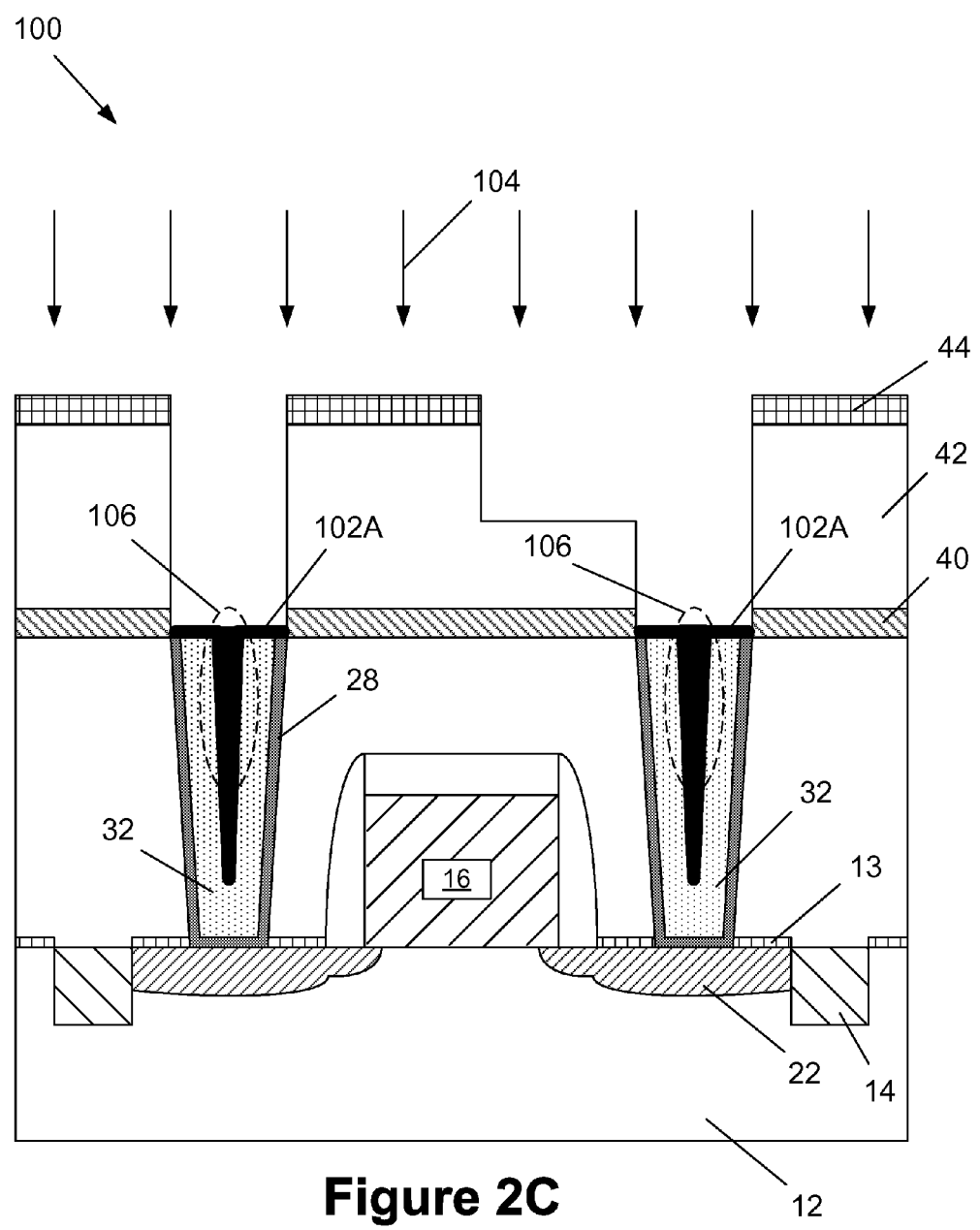

FIG. 2C depicts the device 100 after an anneal process 104 was performed on the device 100. In one embodiment, the anneal process may be performed at a temperature that falls within the range of about 200-400° C. for a duration of about 1-60 minutes. The anneal process 104 may be a laser anneal process, an RTA process, etc. In the case where the selectively formed layer of conductive material 102A is made of cobalt, the cobalt material has a relatively low melting point. Thus, the cobalt material, when heated, will move to substantially fill at least the upper portion of any remaining unfilled portions of the seam or void 31, as indicated in the dashed line regions 106. In some cases, performing the anneal process 104 may cause the selectively formed layer of conductive material 102A to fill substantially all of the void 31. In some applications, selective formation of the layer of conductive material 102A may actually completely fill at least the upper portion of the void 31, or the entire void 31, prior to the anneal process 104 being performed. However, performing the anneal process 104 described herein insures that substantially all of the void 31, if present after the initial formation of the contact 32, or after formation of the layer of conductive material 102A, will be filled. In some applications, some of the millions of contacts 32 formed on an integrated circuit product may be initially formed without any voids therein. Nevertheless, the methods disclosed herein may still be performed to insure that any such voids 31, if present, may be addressed.

Figure 2D:
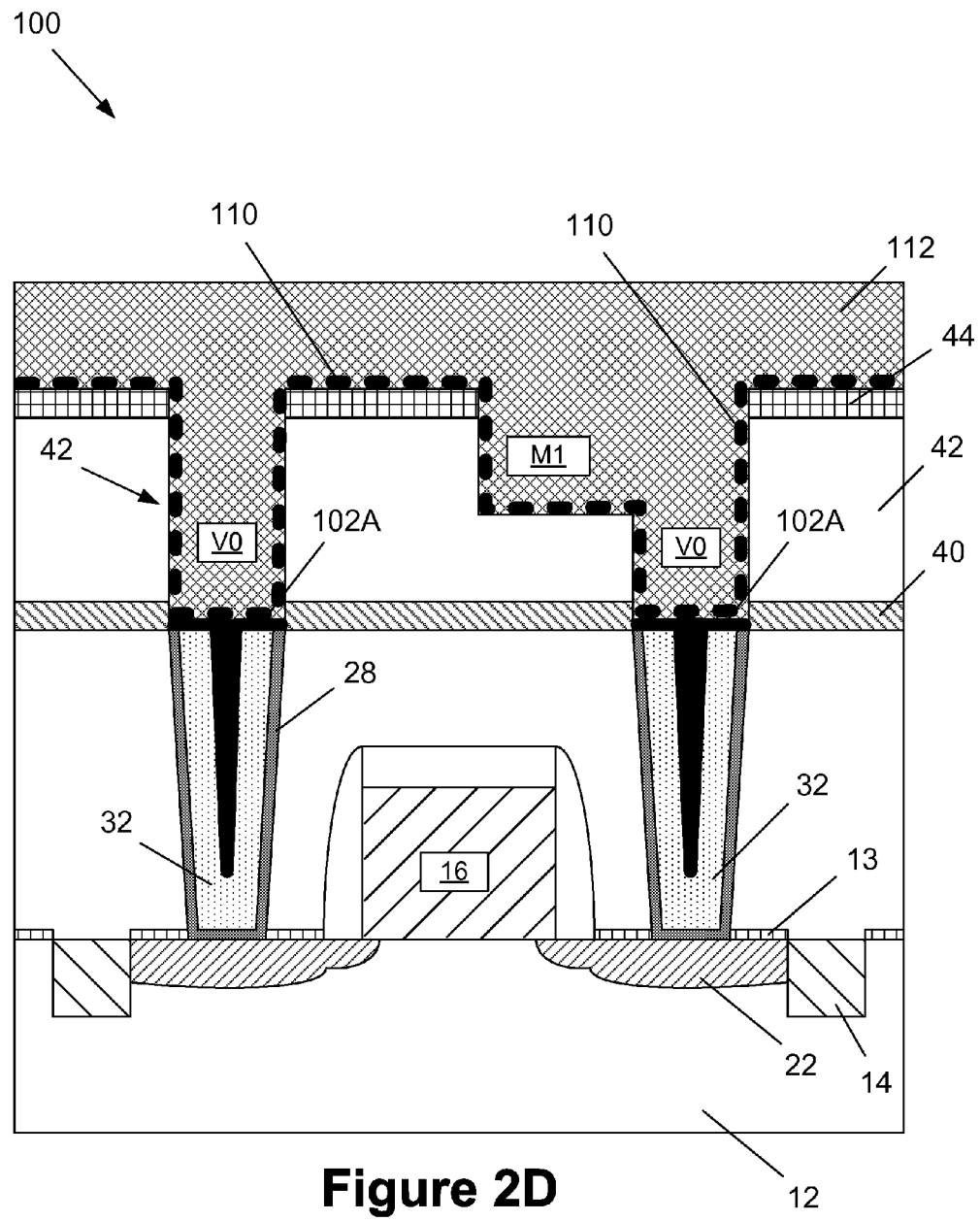

Next, as shown in FIG. 2D, a schematically depicted conductive barrier layer/adhesion layer 110 was formed across the device and in the openings 41. The conductive barrier layer/adhesion layer 110 is depicted with a dashed line so as to clearly distinguish it from the selectively formed layer of conductive material 102A. Of course, in practice, the barrier layer/adhesion layer 110 lines or covers the entire surface of the metallization openings 41. Then, an illustrative layer of bulk conductive material 112, e.g., copper, may be deposited in the openings 41 using traditional techniques. In the case where copper metallization layers will be formed for the device 100, the barrier layer/adhesion layer 110 may be comprised of a first barrier layer of tantalum nitride (TaN) (not separately shown in FIG. 2D) and a second adhesion layer (not separately shown in FIG. 2D) made of tantalum, both of which may be formed by performing sequential conformal deposition processes, e.g., ALD, PVD, etc. Other materials, such as cobalt and ruthenium, may be employed as part of the barrier layer/adhesion layer 110.

Figure 2E:
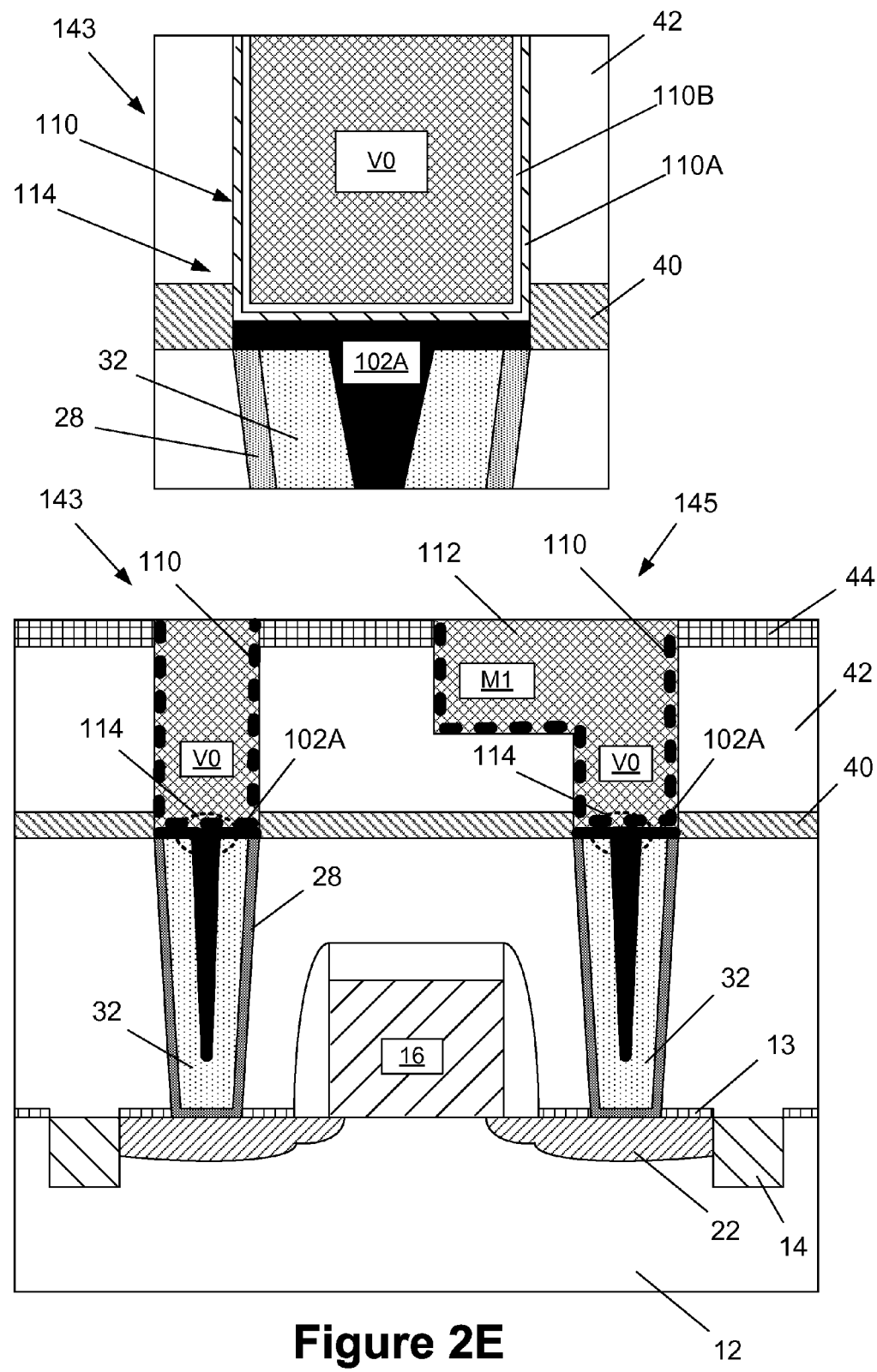

FIG. 2E depicts the device after one or more CMP process operations were performed to remove the excess materials positioned outside of the metallization openings 41 above the etch stop layer 44. This results in the formation of a conductive via 143 (VO) and a combination conductive via (VO)—metal line (M1) 145. FIG. 2E also contains an enlarged view of the novel interface 114 that may be formed using the methods disclosed herein. Also depicted are an illustrative barrier layer 110A and an illustrative adhesion layer 110B of the schematically depicted barrier layer and the adhesion layer 110. Note that the selective deposition process 102 is performed such that sidewalls of the openings 41 along an entire vertical height of the conductive via are substantially free of the selectively formed conductive material layer 102A. Due to the methods disclosed herein, the anneal process 104 is performed to insure that the void 31, if present, is filled prior to the formation of the barrier layer/adhesion layer 110. Accordingly, the barrier layer/adhesion layer 110 is positioned under the entirety of the conductive vias at the interface with the contacts 32, as indicated in the dashed-line regions 114. Thus, there is less likelihood of undesired copper migration using the methods disclosed herein, and the resistance of the connections may not be undesirably increased using the methods disclosed herein.

Figure 3A:
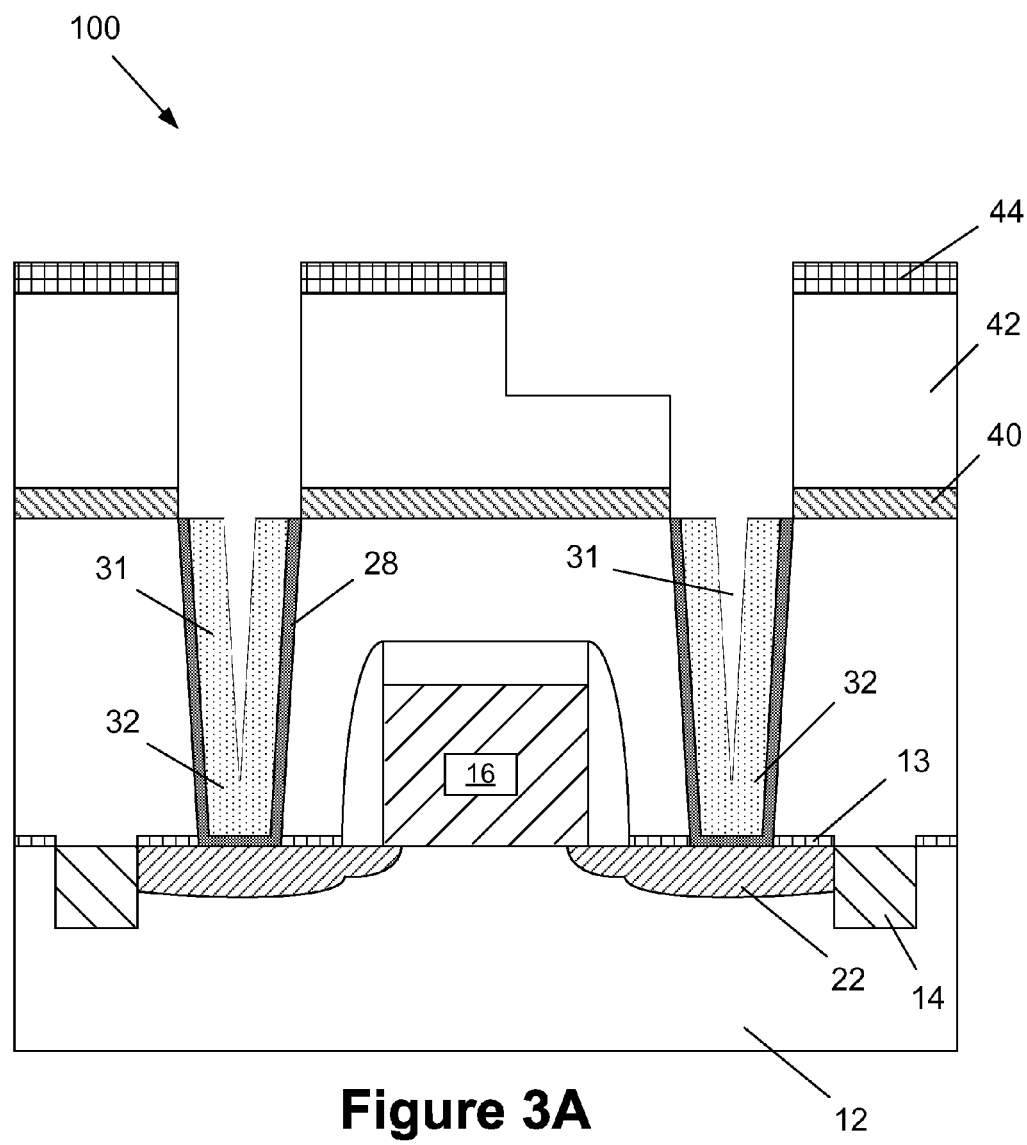
FIGS. 3A-3E depicts yet another illustrative method disclosed herein for forming an improved interface between a conductive via and a conductive contact structure by selective formation of a metal silicide capping layer.

FIGS. 3A-3E depict yet another illustrative method disclosed herein for forming an improved interface between a conductive via and a conductive contact structure by selective formation of a metal silicide capping layer. FIG. 3A depicts the device 100 at a point in processing that corresponds to that depicted in FIG. 1F.

Figure 3B:
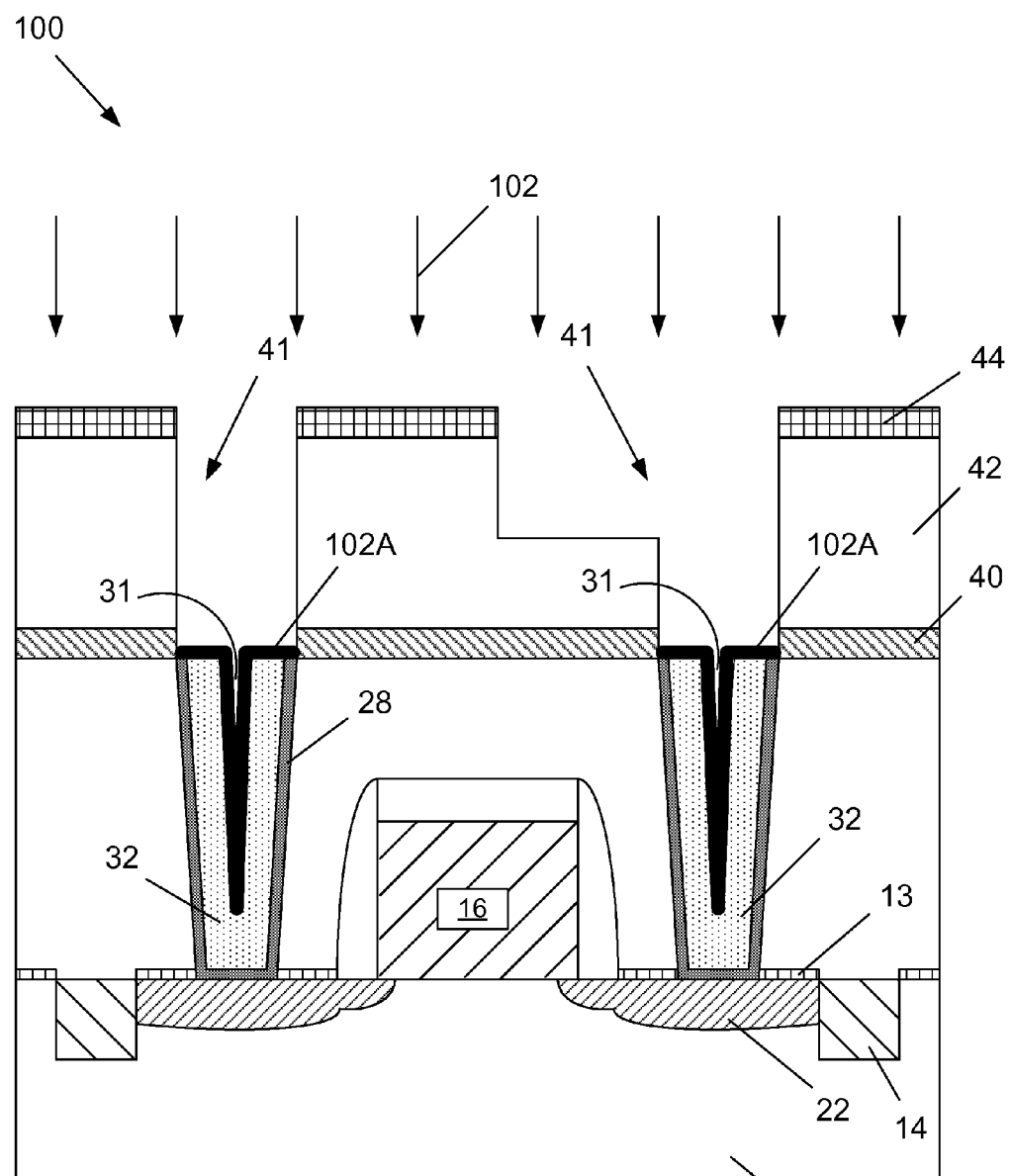

FIG. 3B depicts the device 100 after the above-described selective deposition process 102 was performed to selectively form the layer of conductive material 102A on the contacts 32. As depicted, the layer of conductive material 102A may only partially fill the upper portion of the seam 31. As before, the selective deposition process 102 is performed such that the sidewalls of the metallization openings 41 are substantially free of the selectively formed conductive material layer 102A.

Figure 3C:
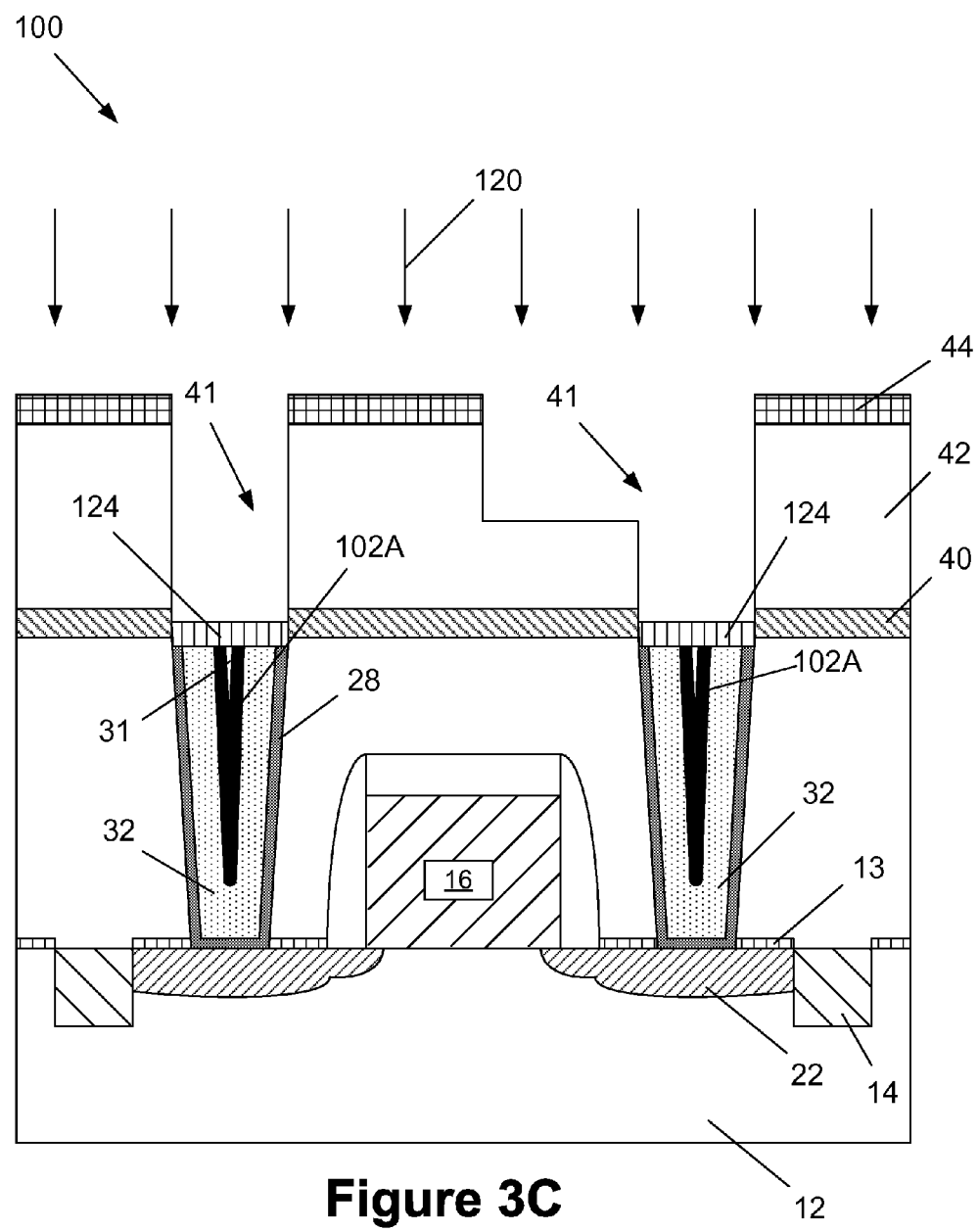

FIG. 3C depicts the device 100 after a selective metal silicide formation process 120 was performed so as to selectively form metal silicide layers 124 on the contacts 32 within the openings 41. Note that the selective metal silicide formation process 120 is performed such that the sidewalls of the metallization openings 41 are substantially free of the selectively formed metal silicide layers 124. In one embodiment, the metal silicide layers 124 may be formed by introducing a silicon-containing precursor gas, such as silane (or another source of silicon) with a flow rate that falls within the range of about 1-1000 sccm, into a plasma environment that is at a temperature of less than, for example, 400° C. for a duration of about 1-60 seconds. As a result of volume expansion when the selectively formed metal silicide layers 124 are formed, at least the upper portions of the seams 31, to the extent present, will be substantially filled by the metal silicide layers 124. It is also possible that the seams 31 will be partially or entirely filled by the conductive material 102A. In the case where the selectively formed layer of conductive material 102A is cobalt, the selectively formed metal silicide layers 124 will be cobalt silicide. In one embodiment, the selectively formed metal silicide layers 124 may have a thickness of about 0.5-5 nm. During this selective metal silicide formation process 120, substantially none of the metal silicide layers 124 are formed on the layers of insulating materials within the metallization openings 41. The manner in which metal silicide layers may be selectively formed are well known to those skilled in the art. For example, see U.S. Pat. No. 4,822,642, which is hereby incorporated by reference in its entirety.

Figure 3D:
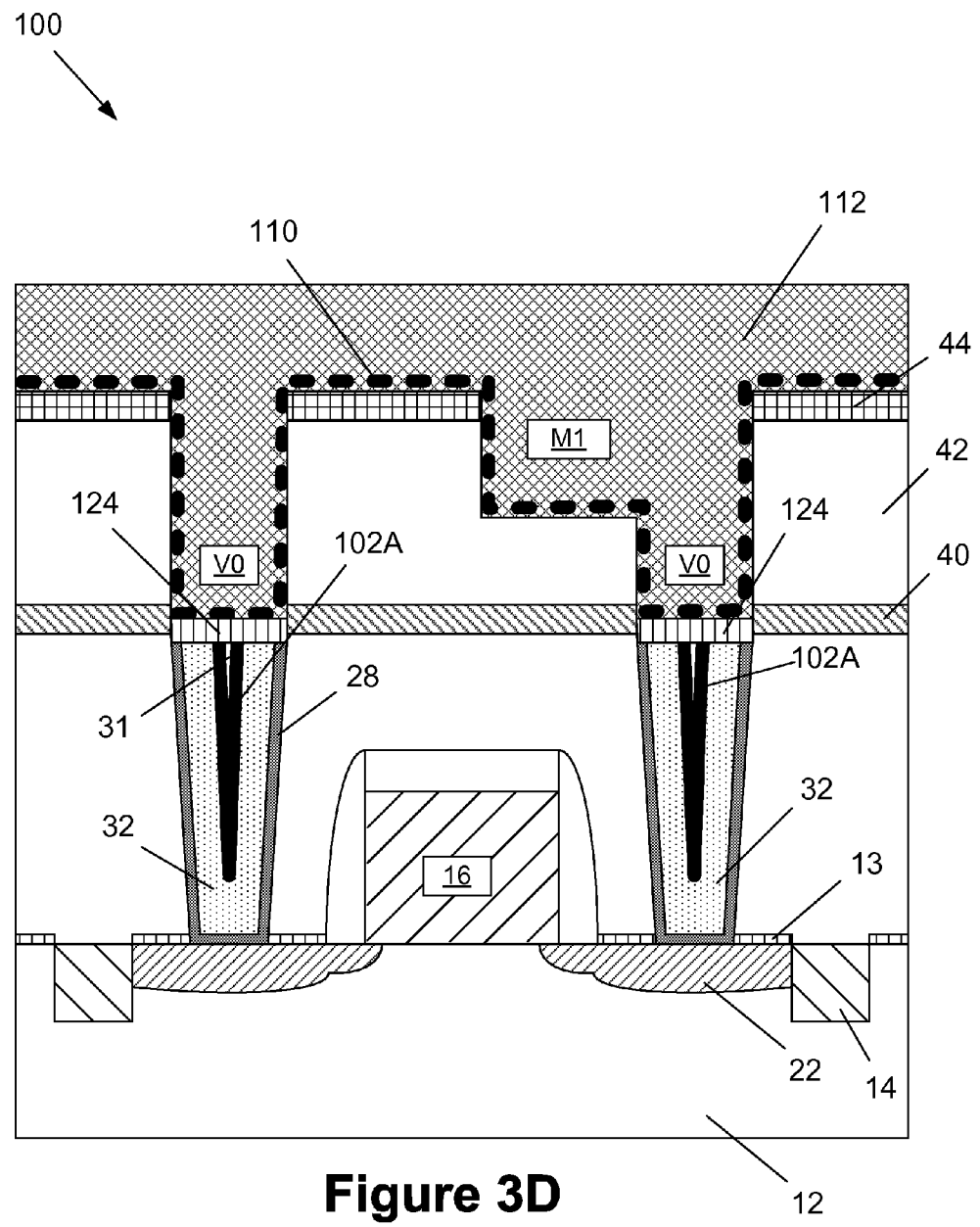

Next, as shown in FIG. 3D, the above-described conductive barrier layer/adhesion layer 110 and layer of conductive material 112 was formed across the device and in the openings 41.

Figure 3E:
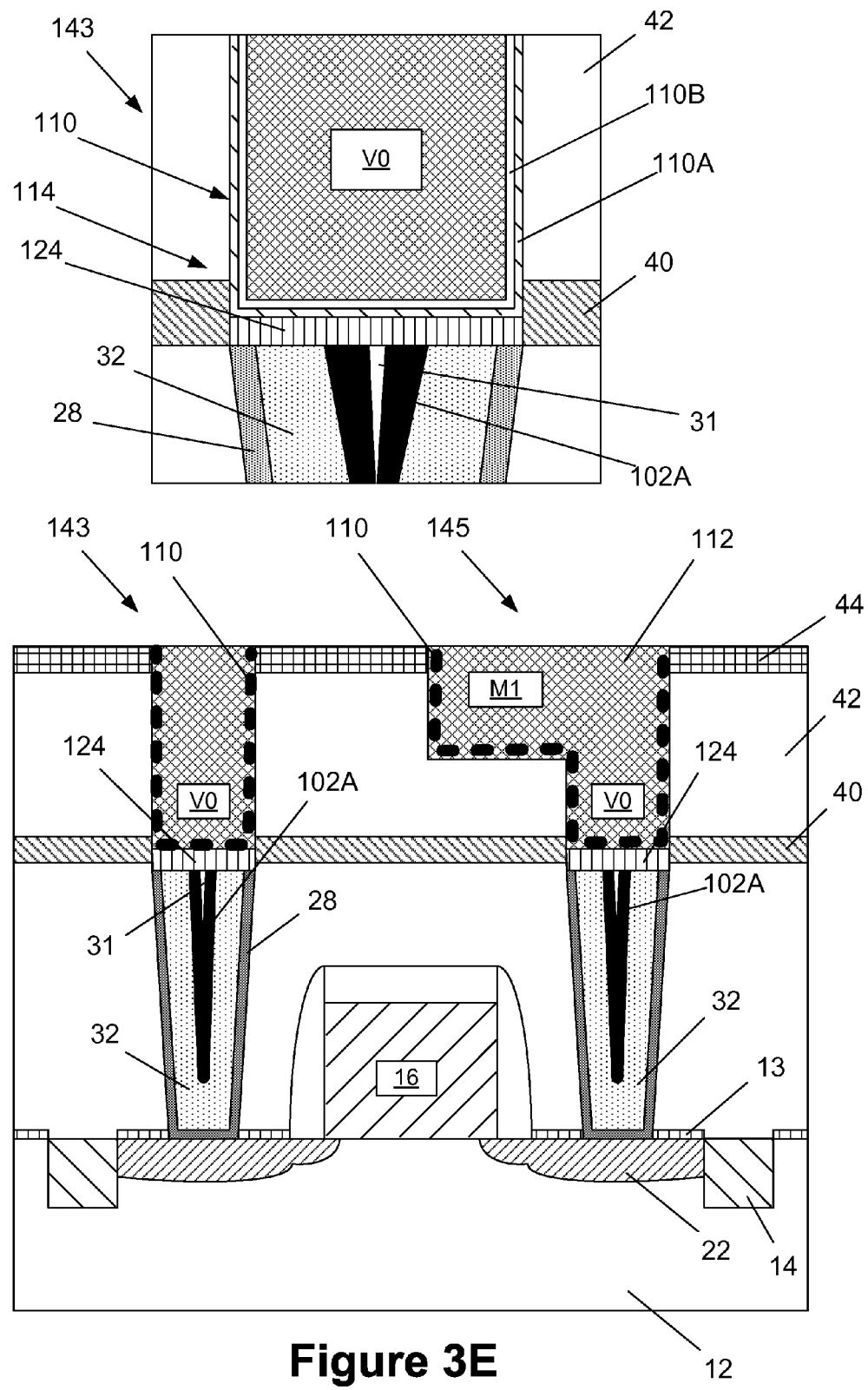

FIG. 3E depicts the device after one or more CMP process operations were performed to remove the excess materials positioned outside of the openings 41 above the etch stop layer 44. This results in the formation of the above-described conductive via 143 (VO) and combination conductive via (VO)—metal line (M1) 145. In this embodiment, due to the formation of the selectively formed metal silicide layers 124, at least the upper portion of the void 31, if present, will be filled prior to the formation of the barrier layer/adhesion layer 110. FIG. 3E also contains an enlarged view of another novel interface 114 that may be formed using the methods disclosed herein. Also depicted are the above-described barrier layer 110A and adhesion layer 110B, as well as the selectively formed metal silicide layer 124. Accordingly, the barrier layer/adhesion layer 110 is positioned under the entirety of the conductive vias at the interface with the contacts 32, as indicated in FIG. 3E. Thus, there is less likelihood of undesired copper migration using the methods disclosed herein, and the resistance of the connections may not be undesirably increased using the methods disclosed herein. Note that the selective metal silicide formation process 120 was performed such that the sidewalls of the metallization openings 41 along an entire vertical height of the conductive via are substantially free of the selectively formed metal silicide layers 124.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming an opening in at least one layer of insulating material positioned above a conductive contact that is conductively coupled to a transistor device so as to thereby expose at least a portion of said conductive contact;
   performing a selective metal silicide formation process to selectively form a metal silicide layer in said opening and on said conductive contact, wherein performing said selective metal silicide formation process comprises generating a plasma environment at a temperature of 400° C. or less and introducing a silicon-containing precursor gas into said plasma environment;

depositing at least one conductive material above said selectively formed metal silicide layer so as to over-fill said opening; and performing at least one planarization process so as to remove excess materials positioned outside of said opening and thereby define a conductive via that is positioned in said opening and conductively coupled to said selectively formed metal silicide layer and to said conductive contact.

2. The method of claim 1, wherein said conductive contact is conductively coupled to one of a source region, a drain region or a gate electrode of said transistor device.

3. The method of claim 1, wherein said conductive contact has a void formed therein.

4. The method of claim 3, wherein said selective metal silicide formation process is performed such that said selectively formed metal silicide layer substantially fills at least an upper portion of said void in said conductive contact.

5. The method of claim 1, wherein said conductive contact as initially formed is substantially free of voids.

6. The method of claim 5, wherein said selective metal silicide formation process is performed such that said selectively formed metal silicide layer is formed in said opening above said conductive contact that is substantially free of voids.

7. The method of claim 1, wherein said selectively formed metal silicide layer is comprised of tantalum silicide, cobalt silicide or ruthenium silicide.

8. The method of claim 1, wherein depositing said at least one conductive material above said selectively formed metal silicide layer so as to over-fill said opening comprises depositing a copper-based material above said selectively formed metal silicide layer so as to over-fill said opening.

9. The method of claim 1, wherein depositing said at least one conductive material above said selectively formed metal silicide layer so as to over-fill said opening comprises forming at least one conductive barrier layer and at least one conductive adhesion layer in said opening, wherein said conductive barrier layer is comprised of tantalum nitride and said conductive adhesion layer comprises a layer of tantalum.

10. The method of claim 1, wherein said selective metal silicide formation process is performed such that sidewalls of said opening in said at least one layer of insulating material along an entire vertical height of said conductive via are substantially free of said selectively formed metal silicide layer.

11. A method, comprising:

forming at least one layer of insulating material above a conductive contact that is conductively coupled to a transistor device, wherein said conductive contact has a void formed therein;

forming an opening in said at least one layer of insulating material so as to expose at least a portion of said conductive contact and said void;

performing a selective metal silicide formation process to selectively form a metal silicide layer in said opening and on said conductive contact and above said void in said conductive contact, wherein performing said selective metal silicide formation process comprises generating a plasma environment at a temperature of 400° C. or less and introducing a silicon-containing precursor gas into said plasma environment;

depositing at least one conductive material above said selectively formed metal silicide layer so as to over-fill said opening; and performing at least one planarization process so as to remove excess materials positioned outside of said opening and thereby define a conductive via that is positioned in said opening and conductively coupled to said metal silicide layer and said conductive contact, wherein said selective metal silicide formation process is performed such that sidewalls of said opening in said at least one layer of insulating material along an entire vertical height of said conductive via are substantially free of said metal silicide layer.

12. The method of claim 11, wherein said selective metal silicide formation process is performed such that said metal silicide layer at least partially fills at least an upper portion of said void in said conductive contact.

13. The method of claim 11, wherein depositing said at least one conductive material above said selectively formed metal silicide layer so as to over-fill said opening comprises depositing a copper-based material.

14. The method of claim 11, wherein depositing said at least one conductive material above said selectively formed metal silicide layer so as to over-fill said opening comprises forming a layer of tantalum nitride and a layer of tantalum.

* * * * *